United States Patent
Tsukada et al.

(10) Patent No.: US 9,478,262 B2
(45) Date of Patent: Oct. 25, 2016

(54) SEMICONDUCTOR DEVICE INCLUDING INPUT/OUTPUT CIRCUIT

(71) Applicant: Micron Technology, Inc., Boise, ID (US)

(72) Inventors: Wataru Tsukada, Kanagawa (JP); Takenori Sato, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/726,063

(22) Filed: May 29, 2015

(65) Prior Publication Data

US 2016/0049180 A1 Feb. 18, 2016

(30) Foreign Application Priority Data

Jun. 16, 2014 (JP) .................................. 2014-123344

(51) Int. Cl.
*G11C 7/10* (2006.01)

(52) U.S. Cl.
CPC ........... *G11C 7/1057* (2013.01); *G11C 7/1084* (2013.01)

(58) Field of Classification Search
CPC .......................... G11C 7/1057; G11C 7/1084
See application file for complete search history.

(56) References Cited

U.S. PATENT DOCUMENTS

| | | | |
|---|---|---|---|
| 2008/0219068 A1 | 9/2008 | Kim et al. | |
| 2012/0056641 A1* | 3/2012 | Kuroki | H03K 19/017545 326/30 |

* cited by examiner

*Primary Examiner* — Richard Elms
*Assistant Examiner* — Mohammed A Bashar
(74) *Attorney, Agent, or Firm* — Dorsey & Whitney LLP

(57) ABSTRACT

Disclosed here is an apparatus that comprises a data terminal, a data output circuit including a plurality of output buffers coupled in common to the data terminal, and an impedance control circuit coupled to the data output circuit, wherein the impedance control circuit is configured to generate first impedance code and second impedance code different from the first impedance code and to apply a selected one of the first impedance code and the second impedance code to at least one of the output buffers.

18 Claims, 9 Drawing Sheets

SEMICONDUCTOR DEVICE INCLUDING INPUT/OUTPUT CIRCUIT

This application is based upon and claims the benefit of priority from Japanese Patent Application No. 2014-123344 filed on Jun. 16, 2014, the disclosure of which are incorporated herein in its entirely by reference.

BACKGROUND OF THE INVENTION

1. Field of the Invention

The present invention relates to a semiconductor device and particularly to a semiconductor device including an output buffer capable of impedance adjustment.

2. Description of Related Art

A semiconductor device, such as DRAM (Dynamic Random Access Memory), includes an output buffer for outputting data to the outside. The output buffer is so designed that it has a desired impedance when activated. However, the output buffer does not always have the design-based desired impedance because process irregularities and temperature changes affect the output buffer's impedance. For this reason, a semiconductor device required to precisely control the impedance of its output buffer has a built-in impedance adjusting circuit, which is called calibration circuit.

The calibration circuit is configured such that a replica unit identical in circuit configuration with a pull-up unit included in the output buffer is connected to a calibration terminal. The calibration circuit performs calibration by controlling the impedance of the replica unit so that a potential at the calibration terminal matches a desired voltage level and reflecting the controlled impedance on the pull-up unit of the output buffer.

The output buffer may be used as a termination resistor when a write operation is carried out. When the output buffer functions as the termination resistor, the impedance adjusted by the calibration operation is used as the impedance of the output buffer (Japanese Patent Application Laid Open No. 2008-228276, also published as U.S. Pat. Pub. No. 2008-0219068).

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purposes.

The semiconductor device 10 of this embodiment is a DDR4 (Double Data Rate 4) DRAM packaged in a single semiconductor chip, and is mounted on an external substrate 2. The external substrate 2 is a memory module substrate or motherboard, and is provided with a reference resistance RZQ. The reference resistance RZQ is connected to a calibration terminal ZQ of the semiconductor device 10, and the impedance of the reference resistance RZQ is used as a reference impedance to a calibration circuit 50. The reference resistance RZQ is supplied with a ground voltage VSSQ in this embodiment.

Figure 1:
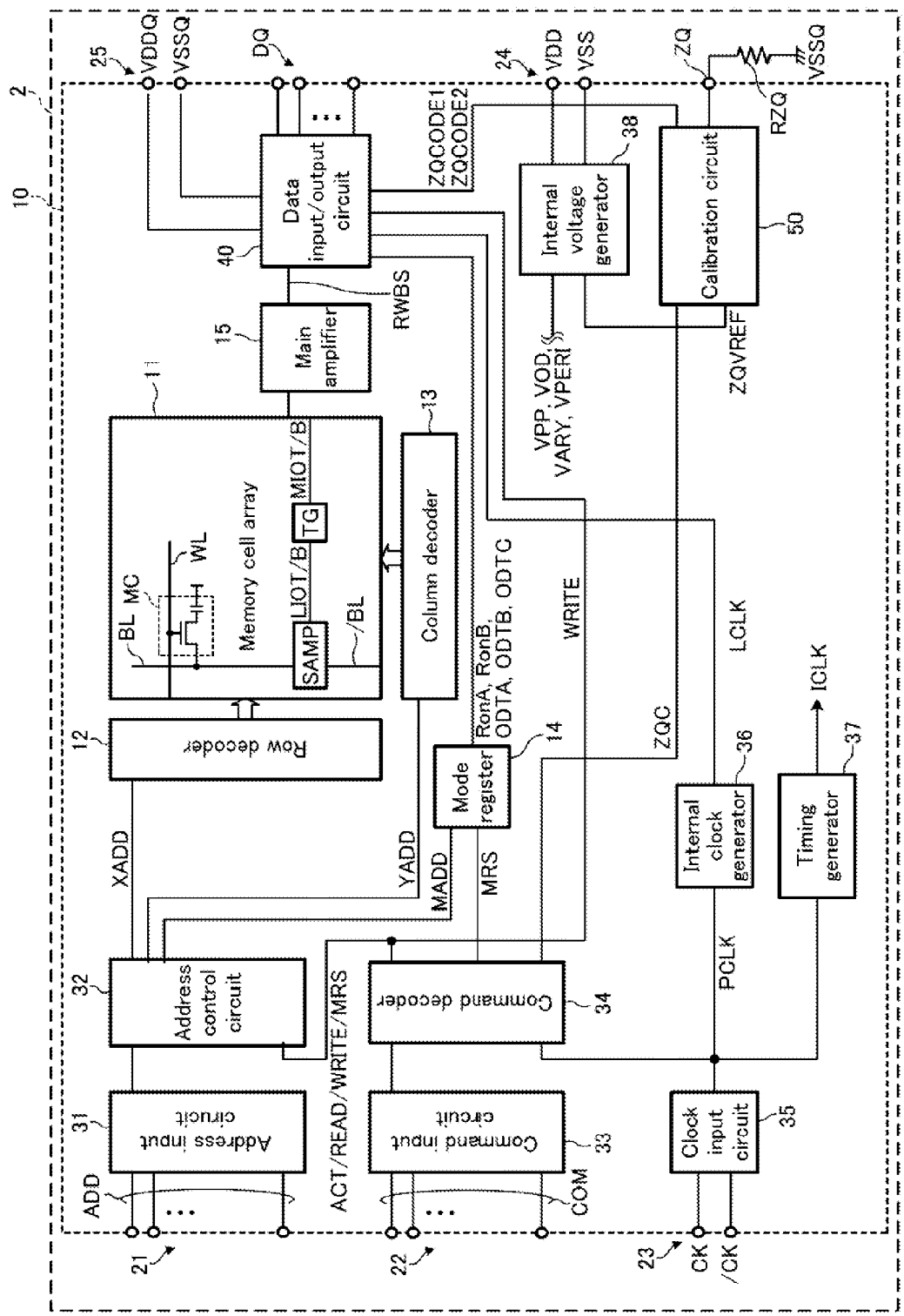
FIG. 1 is a block diagram of an overall configuration of a semiconductor device according to a first embodiment.

Referring now to FIG. 1, the semiconductor device 10 according to a first embodiment of the present invention includes a memory cell array 11. The memory cell array 11 has multiple word lines WL, multiple bit lines BL and /BL, and memory cells MC arranged at the intersections of the word lines WL and the bit lines BL and /BL. A word line WL is selected by a row decoder 12, while a bit line BL is selected by a column decoder 13.

Paired bit lines BL and /BL are connected to a sense amplifier SAMP disposed in the memory cell array 11. The sense amplifier SAMP amplifies a potential difference created between the bit line BL and the bit line /BL and supplies read data obtained by amplifying the potential difference to a complementary local data line LIOT/LIOB. The read data supplied to the local data line LIOT/LIOB is transferred to a complementary main data line MIOT/MIOB via a switch circuit TG. The read data on the main data line MIOT/MIOB is then converted into a single-ended signal by a main amplifier 15 and is supplied to a data input/output circuit 40 via a read/write bus RWBS.

The semiconductor device 10 also includes an address terminal 21, a command terminal 22, a clock terminal 23, power terminals 24 and 25, a data input/output terminal DQ, and the calibration terminal ZQ, which serve as external terminals.

The address terminal 21 is a terminal that receives an address signal ADD that is an incoming external signal. The address signal ADD input to the address terminal 21 is supplied to an address control circuit 32 via an address input circuit 31. Among address signals ADD supplied to the address control circuit 32, an address signal ADD representing a row address XADD is supplied to the row decoder 12, an address signal ADD representing a column address YADD is supplied to the column decoder 13, and an address signal ADD representing a mode signal MADD is supplied to a mode register 14.

The mode register 14 is a circuit with which parameters indicative of an operation mode of the semiconductor device 10 are registered. The mode register 14 outputs mode signals, such as impedance selection signals RonA, RonB, and ODTA to ODTC, which are supplied to the data input/output circuit 40. The impedance selection signals RonA and RonB are signals for selecting an output impedance at execution of a read operation, and the impedance selection signals ODTA to ODTC are signals for selecting a termination impedance at execution of a termination operation. The termination operation is executed during execution of a write operation.

The command terminal 22 is a terminal that receives an incoming external command signal COM. The command signal COM input to the command terminal 22 is supplied to a command decoder 34 via a command input circuit 33. The command decoder 34 is a circuit that generates various internal commands by decoding the command signal COM. Internal commands include an active signal ACT, a read signal READ, a write signal WRITE, a mode register setting signal MRS, and a calibration signal ZQC.

The active signal ACT is a signal that is activated when the command signal COM indicates a row-accessing command (active command). When the active signal ACT is activated, the row address XADD latched by the address control circuit 32 is supplied to the row decoder 12. As a result, a word line WL specified by the row address XADD is selected.

The read signal READ and the write signal WRITE are activated when the command signals COM indicate a read command and a write command, respectively. When the read signal READ or write signal WRITE is activated, the column address YADD latched by the address control circuit 32 is supplied to the column decoder 13. As a result, a bit line BL specified by the column address YADD is selected.

When the active command and read command are input and the row address XADD and column address YADD are also input in synchronization with input of the active command and read command, therefore, read data is read from the memory cell MC specified by the row address XADD and column address YADD. The read data is transferred to the data input/output terminal DQ via the main amplifier 15 and the data input/output circuit 40 and is output from the data input/output terminal DQ to the outside When the active command and write command are input, and the row address XADD and column address YADD are also input in synchronization with input of the active command and write command, and then write data is input to the data input/output terminal DQ, the write data is supplied to the memory cell array 11 via the data input/output circuit 40 and the main amplifier 15 and is written to the memory cell MC specified by the row address XADD and column address YADD.

The mode register setting signal MRS is a signal that is activated when the command signal COM indicates a mode register setting command. When the mode register setting command is input and the mode signal MADD is input through the address terminal 21 in synchronization with input of the mode register setting command, therefore, a preset value in the mode register 14 can be rewritten.

The calibration signal ZQC is a signal that is activated when the command signal COM indicates a calibration command. When the calibration signal ZQC is activated, the calibration circuit 50 executes a calibration operation, thereby generates impedance codes ZQCODE1 and ZQCODE2.

The write signal WRITE is supplied to the data input/output circuit 40, where the write signal WRITE dynamically changes the impedances of individual output buffers included in the data input/output circuit 40. This process will be described later.

The external terminals included in the semiconductor device 10 will be described again. The clock terminal 23 receives incoming external clock signals CK and /CK. The external clock signal CK and the external clock signal /CK are complementary to each other, and are supplied to a clock input circuit 35. Receiving the incoming external clock signals CK and /CK, the clock input circuit 35 generates an internal clock signal PCLK, which is supplied to an internal clock generator 36, which then generates a phase-controlled internal clock signal LCLK out of the internal clock signal PCLK. The internal clock generator 36 is provided as, for example, a DLL circuit, which is, however, not the only circuit used as the internal clock generator 36. The internal clock signal LCLK is supplied to the data input/output circuit 40, which uses the internal clock signal LCLK as a timing signal for determining timing of outputting read data.

The internal clock signal PCLK is supplied also to a timing generator 37, which generates various internal clock signals ICLK based on the internal clock signal PCLK. The internal clock signals ICLK generated by the timing generator 37 are supplied to such circuit blocks as the address control circuit 32 and command decoder 34, where the internal clock signals ICLK regulate the operation timing of the circuit blocks.

The power terminal 24 is a terminal supplied with the source voltages VDD and VSS. The source voltages VDD and VSS supplied to the power terminal 24 are supplied to an internal voltage generator 38, which generates various internal voltages VPP, VOD, VARY, and VPERI and a reference voltage ZQVREF, based on the source voltages VDD and VSS. The internal voltage VPP is a voltage used mainly by the row decoder 12, the internal voltages VOD and VARY are voltages used by the sense amplifier SAMP in the memory cell array 11, and the internal voltage VPERI is a voltage used by a number of other circuit blocks. The reference voltage ZQVREF is a reference voltage used by the calibration circuit 50.

The power terminal 25 is a terminal supplied with source voltages VDDQ and VSSQ. The source voltages VDDQ and VSSQ supplied to the power terminal 25 are supplied to the data input/output circuit 40. The source voltages VDDQ and VSSQ are identical in potential with the source voltages VDD and VSS supplied to the power terminal 24, respectively. To prevent power noise generated by the data input/output circuit 40 from propagating to other circuit blocks, the source voltages VDDQ and VSSQ are used exclusively as source voltages to the data input/output circuit 40.

The calibration terminal ZQ is connected to the calibration circuit 50. When activated by the calibration signal ZQC, the calibration circuit 50 carries out the calibration operation, referring to the impedance of the reference resistance RZQ and to the reference voltage ZQVREF. The impedance codes ZQCODE1 and ZQCODE2 acquired by the calibration operation are supplied to the data input/output circuit 40, where the impedance of an output buffer included in the data input/output circuit 40 is specified according to the impedance codes ZQCODE1 and ZQCODE2.

Figure 2:
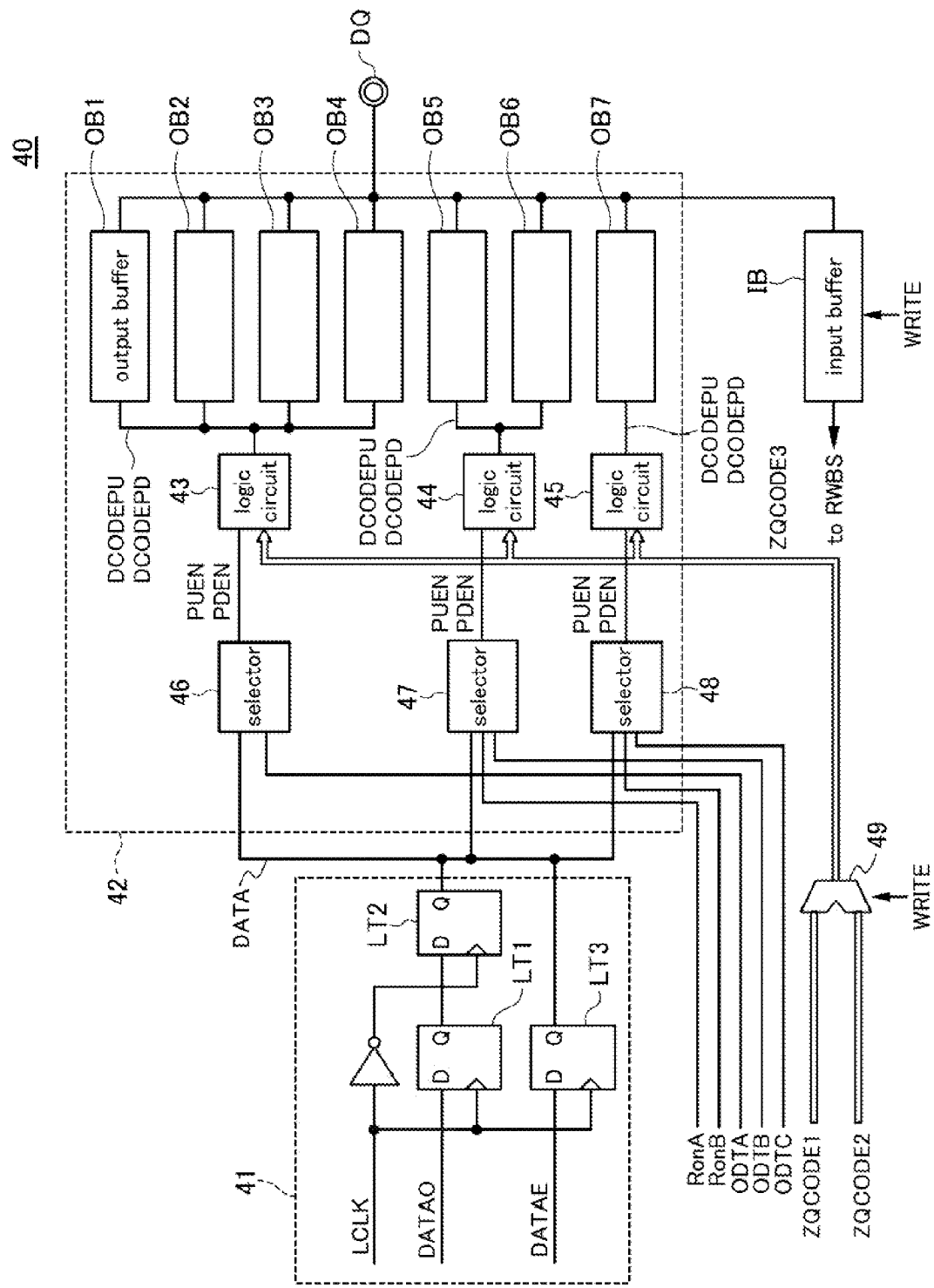
FIG. 2 is a circuit diagram showing a part of a data input/output circuit.

FIG. 2 is a circuit diagram showing a part of the data input/output circuit 40.

As shown in FIG. 2, the data input/output circuit 40 includes a FIFO circuit 41, a data output circuit 42, and an input buffer IB. The FIFO circuit 41 has latch circuits LT1 to LT3 that convert parallel read data DATAO and DATAE, which are transferred to the FIFO circuit 41 via the read/write bus RWBS, into serial data in synchronization with the internal clock signal LCLK. The read data DATAO and DATAE Input as parallel data via the read/write bus RWBS are thus converted into serial read data DATA, which is supplied to the data output circuit 42.

The data output circuit 42 has seven output buffers OB1 to OB7 connected in parallel between the FIFO circuit 41 and the data input/output terminal DQ. These output buffers OB1 to OB7 are identical in circuit configuration with each other, and their impedances for read data output from the data input/output terminal DQ are changed by selecting the number of the output buffers OB1 to OB7 to be activated. Hereinafter, when distinguishing the output buffers OB1 to OB7 from each other is not particularly necessary, each of the output buffers OB1 to OB7 may be simply referred to as "output buffer OB". Seven output buffers OB1 to OB7 are used in this embodiment. It is obvious, however, that the present invention does not limit the number of the output buffers OB1 to OB7 to seven.

According to this embodiment, seven output buffers OB1 to OB7 are classified into three groups. A first group consists of four output buffers OB1 to OB4 and is connected to the FIFO circuit 41 via a logic circuit 43 and a selector 46 that are common to the output buffers OB1 to OB4. A second group consists of two output buffers OB5 to OB6 and is connected to the FIFO circuit 41 via a logic circuit 44 and a selector 47 that are common to the output buffers OB5 and OB6. A third group consists of one output buffer OB7 and is connected to the FIFO circuit 41 via a logic circuit 45 and a selector 48.

The selectors 46 to 48 generate enable signals PUEN and PDEN, based on the read data DATA and the impedance signals RonA, RonB, and ODTA to ODTC, and selectively determine whether or not to activate the output buffers OB1 to OB7 included in the groups corresponding to the selectors 48 to 48, respectively. The impedance signals RonA and RonB are signals for selecting an output impedance at execution of the read operation, and the impedance signals ODTA to ODTC are signals for selecting a termination impedance at execution of the termination operation.

The termination operation is executed during execution of the write operation. When the write operation is executed, the input buffer IB is activated, so that external data input to the data input/output circuit 40 via the data input/output terminal DQ is received by the input buffer IB and is transferred to the amplifier 15 via the read/write bus RWBS. When the input buffer IB receives the data, the output buffer OB carries out the termination operation, which causes the data input/output terminal DQ to function as a termination resistor, thus preventing signal reflection. The output buffer OB is, therefore, activated not only at execution of the read operation but also at execution of the write operation.

According to this embodiment, the impedance selection signals RonA and RonB are supplied to the selectors 47 and 48, respectively, and the impedance selection signals ODTA to ODTC are supplied to the selectors 46 to 48, respectively. An impedance selection signal for impedance selection at execution of the read operation is not input to the selector 46. As a result, the output buffers OB1 to 084 are kept activated during execution of the read operation.

Each output buffer OB is so designed that its impedance at execution of the read operation is adjusted to, for example, 240Ω. When the impedance selection signals RonA and RonB are activated so that all the output buffers OB1 to OB7 are activated, therefore, the overall impedance for read data is 34.3Ω (=240Ω/7). When only the impedance selection signal RonA is activated so that six output buffers OB1 to OB6 are activated, the overall impedance for read data is 40Ω (=240Ω/6). When only the impedance selection signal RonB is activated so that five output buffers OB1 to OB4 and OB7 are activated, the overall impedance for read data is 48Ω (=240Ω/5). When the impedance selection signals RonA and RonB are deactivated so that four output buffers OB1 to OB4 are left activated, the overall impedance for read data is 60Ω (=240Ω/4).

Such impedance selection can be performed also at execution of the termination operation in the same manner as described above, using the impedance selection signals ODTA to ODTC. However, by impedance switching, the impedance of the output buffer OB at execution of the termination operation is determined to be different from the impedance of the output buffer OB at execution of the read operation. This impedance switching will be described later.

The impedance of the output buffer OB is not always set to the design-based impedance of 240Ω because process irregularities and temperature changes affects the output buffer's impedance. To correct such an impedance shift, the output buffer OB is provided with an impedance-adjustable pull-up unit PU and an impedance-adjustable pull-down unit PD. Adjustment of the impedance of the output buffer OB is performed by one of the logic circuits 43 to 45 corresponding to the output buffer OB.

The logic circuits 43 to 45 are each supplied with the enable signals PUEN and PDEN from the corresponding selectors 46 to 48 and with a common impedance code ZQCODE3 from a selector 49. Each of the logic circuits 43 to 45 carries out logical calculation using the incoming enable signals PUEN and PDEN and impedance code ZQCODE3 to generate impedance codes DCODEPU and DCODEPD, and supplies the generated impedance codes DCODEPU and DCODEPD to the output buffer OB. Hence the impedance of the output buffer OB is adjusted to a desired impedance. The impedance code ZQCODE3 is composed of a pull-up impedance code CODEUP and a pull-down impedance code CODEPD, which will be described later.

The selector 49 selects one of the impedance codes ZQCODE1 and ZQCODE2 supplied from the calibration circuit 50 and outputs the selected impedance code as the impedance code ZQCODE3, to the logic circuits 43 to 45. The selector 49 selects one of the impedance codes ZQCODE1 and ZQCODE2 based on the write signal WRITE. Specifically, when the write signal WRITE is not activated, that is, when the read operation is carried out, the impedance code ZQCODE1 is selected and is output as the impedance code ZQCODE3. When the write signal WRITE is activated, that is, when the write operation is carried out, the impedance code ZQCODE2 is selected and is output as the impedance code ZQCODE3.

The impedance code ZQCODE3 includes the impedance code CODEPU that adjusts the impedance of the pull-up unit PU and the impedance code CODEPD that adjusts the impedance of the pull-down unit PD. According to this embodiment, each of the impedance codes CODEPU and CODEPD is a 5-bit signal.

Figure 3:
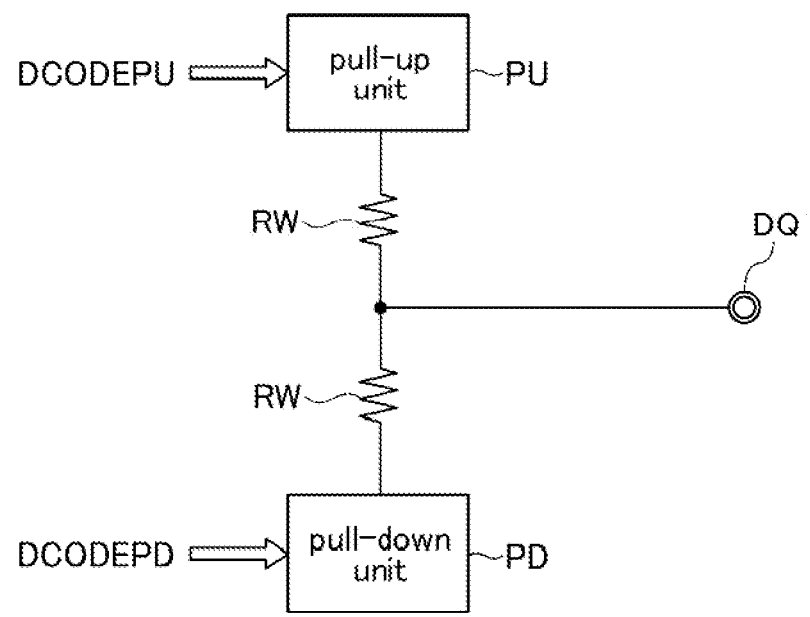
FIG. 3 is a circuit diagram of an output buffer.

FIG. 3 is a circuit diagram of the output buffer OB.

As shown in FIG. 3, the output buffer OB is configured such that a resistor RW is interposed between the data input/output terminal DQ and the pull-up unit PU and between the data input/output terminal DQ and the pull-down unit PD. The pull-up unit PU is supplied with the impedance code DCODEPU by which the impedance of the pull-up unit PU is adjusted. The pull-down unit PD is supplied with the impedance code DCODEPD by which the impedance of the pull-down unit PD is adjusted. The resistor RW has a resistance value of, for example, about 40Ω and is made of a tungsten wire, etc.

Figure 4:
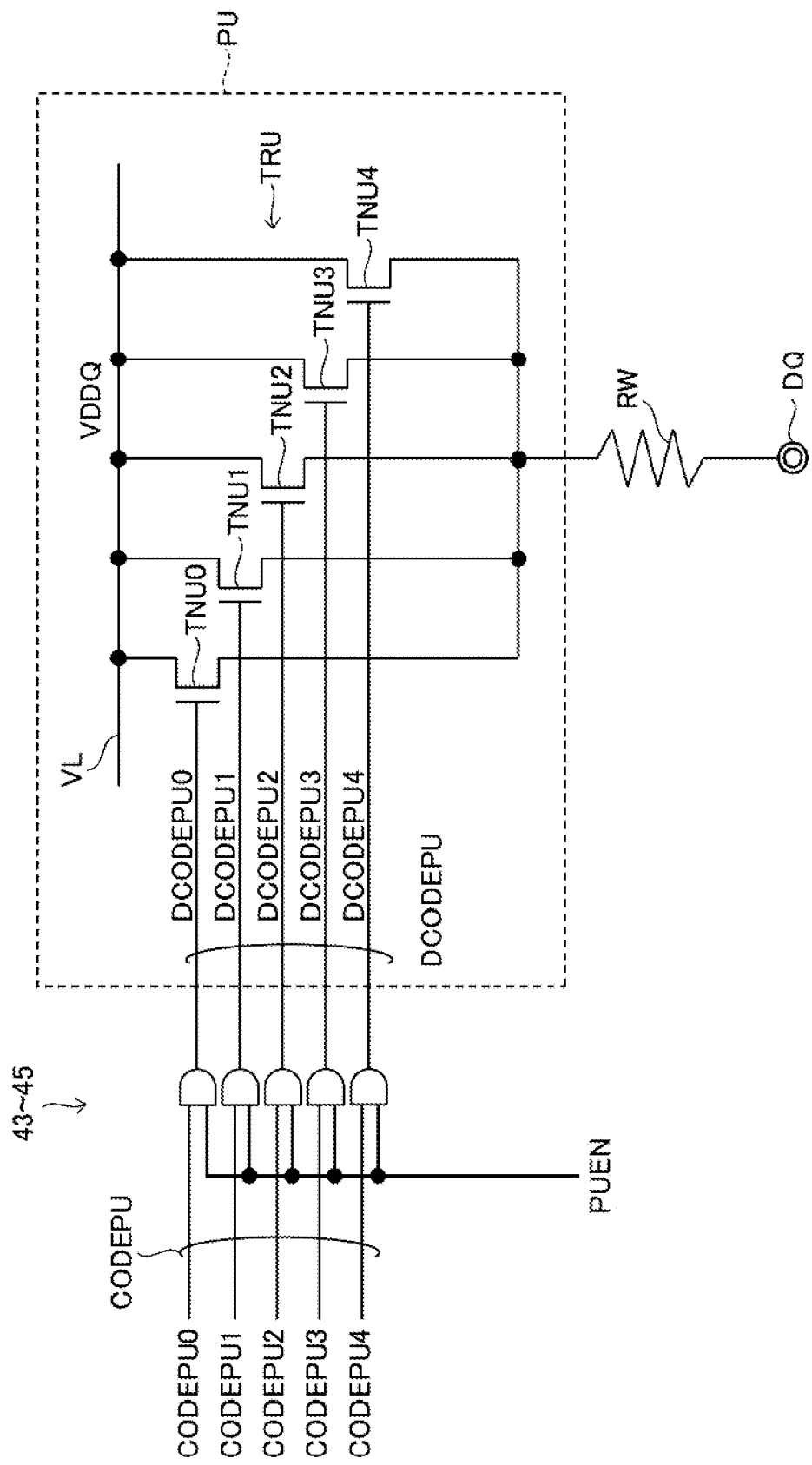
FIG. 4 is a circuit diagram of a pull-up unit.

FIG. 4 is a circuit diagram of the pull-up unit PU.

As shown in FIG. 4, the pull-up unit PU is composed of five n-channel MOS transistors TNU0 to TNU4 connected in parallel. The drains of the transistors TNU0 to TNU4 are connected in common to a voltage line VL through which the source voltage VDDQ is supplied, while the sources of the transistors TNU0 to TNU4 are connected to the data input/output terminal DQ via the resistor RW.

The gate electrodes of the transistors TNU0 to TNU4 are supplied with bits DCODEPU0 to DCODEPU4, respectively, the bits DCODEPU0 to DCODEPU4 making up the impedance code DCODEPU. As a result, five transistors TNU0 to TNU4 are separately switched on and off based on a value for the impedance code DCODEPU. As shown in FIG. 4, the impedance code DCODEPU is a signal generated by each of the logic circuits 43 to 45 in such a way that each bit of the impedance code CODEPU and the enable signal PUEN are logically synthesized through an AND gate circuit.

When the enable signal PUEN is deactivated to its low-voltage level, therefore, the bits DCODEPU0 to DCODEPU4 making up the impedance code DCODEPU are all put in their low-voltage state regardless of what value the impedance code CODEPU takes, in which case the transistors TNU0 to TNU4 are all switched off. When the enable signal PUEN is activated to its high-voltage level, on the other hand, a value for the impedance code CODEPU is used directly as a value for the impedance code DCODEPU, in which case some of the transistors TNU0 to TNU4 are switched on.

Figure 5:
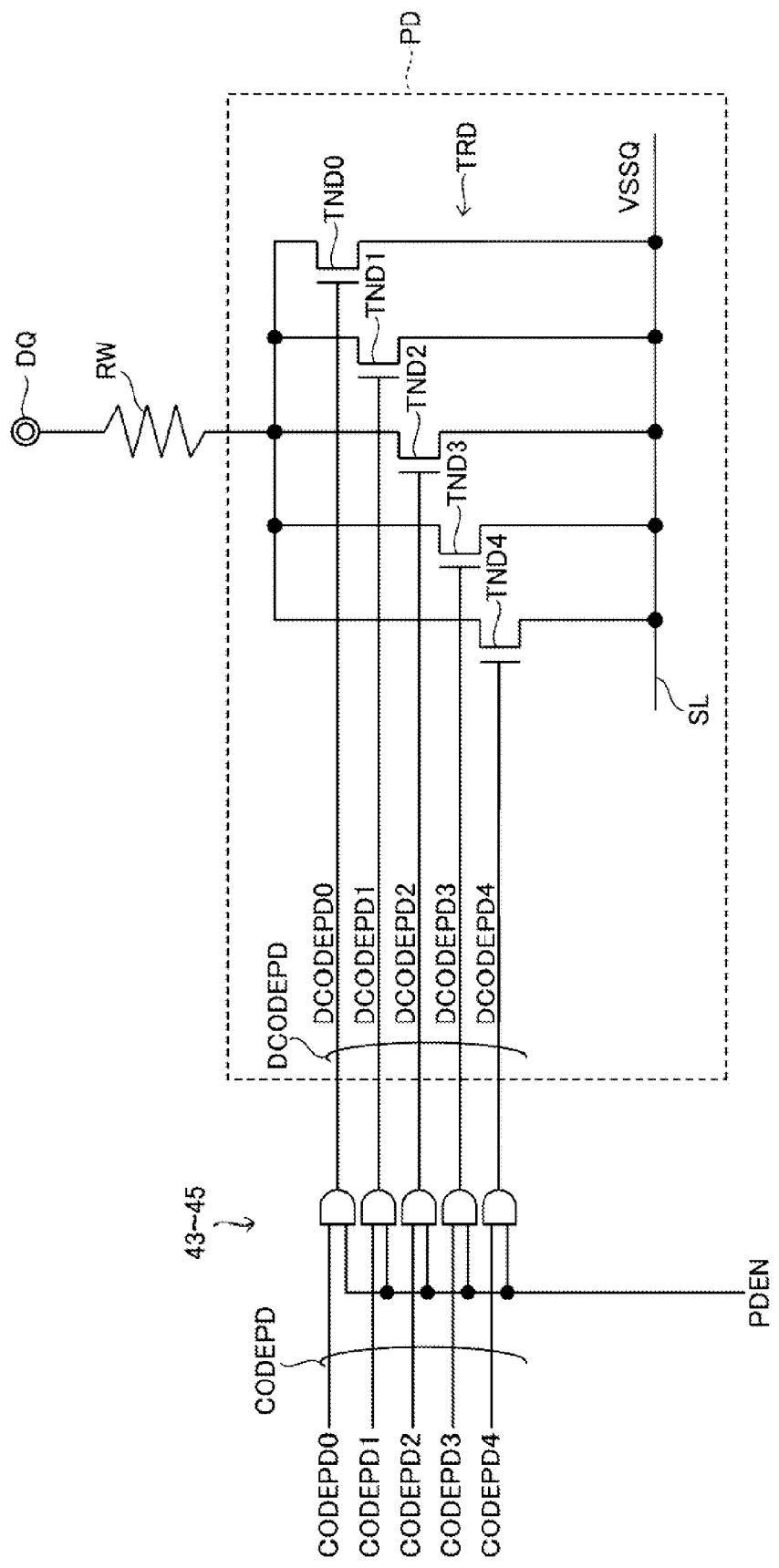
FIG. 5 is a circuit diagram of a pull-down unit.

The channel width (W)/channel length (L) ratio (W/L ratio), i.e., the current supply capacity of each of the transistors TNU0 to TNU4 is weighted with a factor of the second power of 2. Specifically, the transistors TNU0 to TNU4 are designed such that when the W/L ratio of the transistor TNU0 is 1WLnu, the W/L ratio of a transistor TNUk (k=0 to 4) is $2^K \times$WLnu. This allows the impedance of the pull-up unit PU to be adjusted in 32 stages at maximum. FIG. 5 is a circuit diagram of the pull-down unit PD.

As shown in FIG. 5, the pull-down unit PD is composed of five n-channel MOS transistors TND0 to TND4 connected in parallel. The sources of the transistors TND0 to TND4 are connected in common to a voltage line SL through which the source voltage VSSQ is supplied, while the drains of the transistors TND0 to TND4 are connected to the data input/output terminal DQ via the resistor RW.

The gate electrodes of the transistors TND0 to TND4 are supplied with bits DCODEPD0 to DCODEPD4, respectively, the bits DCODEPD0 to DCODEPD4 making up the impedance code DCODEPD. As a result, five transistors TND0 to TND4 are separately switched on and off based on a value for the impedance code DCODEPD. As shown in FIG. 5, the impedance code DCODEPD is a signal generated by each of the logic circuits 43 to 45 in such a way that each bit of the impedance code CODEPD and the enable signal PUED are logically synthesized through an AND gate circuit.

When the enable signal PDEN is deactivated to its low-voltage level, therefore, the bits DCODEPD0 to DCODEPD4 making up the impedance code DCODEPD are all put in their low-voltage state regardless of what value the impedance code CODEPD takes, in which case the transistors TND0 to TND4 are all switched off. When the enable signal PDEN is activated to its high-voltage level, on the other hand, a value for the impedance code CODEPD is used directly as a value for the impedance code DCODEPD, in which case some of the transistors TND0 to TND4 are switched on.

The channel width (W)/channel length (L) ratio (W/L ratio), i.e., the current supply capacity of each of the transistors TND0 to TND4 is weighted with a factor of the second power of 2. Specifically, the transistors TND0 to TND4 are designed such that when the W/L ratio of the transistor TND0 is 1WLnd, the W/L ratio of a transistor TNDk (k=0 to 4) is $2^K \times$WLnd. This allows the impedance of the pull-down unit PD to be adjusted also in 32 stages at maximum.

In this manner, the impedances of the pull-up unit PU and the pull-down unit PD can be adjusted by the impedance codes CODEPU and CODEPD, respectively. As a result, the impedance of the output buffer OB can be adjusted to a desired impedance at execution of the read operation or write operation. In the above example, the pull-up unit PU is composed of five n-channel MOS transistors TNU0 to TNU4 and the pull-down unit PD is composed of five n-channel MOS transistors TND0 to TND4. It is however obvious that the configuration of the pull-up unit and pull-down unit of the present invention is not limited to the above configuration. For example, each of the pull-up unit PU and pull-down unit PD may be composed of six transistors. In such a case, the impedance of each of the pull-up unit PU and pull-down unit PD can be adjusted in 64 stages at maximum. In this manner, the configuration of the pull-up unit PU and pull-down unit PD can be changed properly according to impedance precision that the product is required to have.

At execution of the read operation, either the enable signal PUEN or PDEN is activated to its high-voltage level based on the logical level of the read data DATA. At execution of the read operation, therefore, either the pull-up unit PU or pull-down unit PD is activated based on the logical level of the read data DATA. As a result, the data input/output terminal DQ is put in its high-voltage state or low-voltage state. At execution of the write operation, on the other hand, the enable signal PUEN is activated to its high-voltage level. As a result, the data input/output terminal DQ terminates at the source voltage VDDQ.

Figure 6:
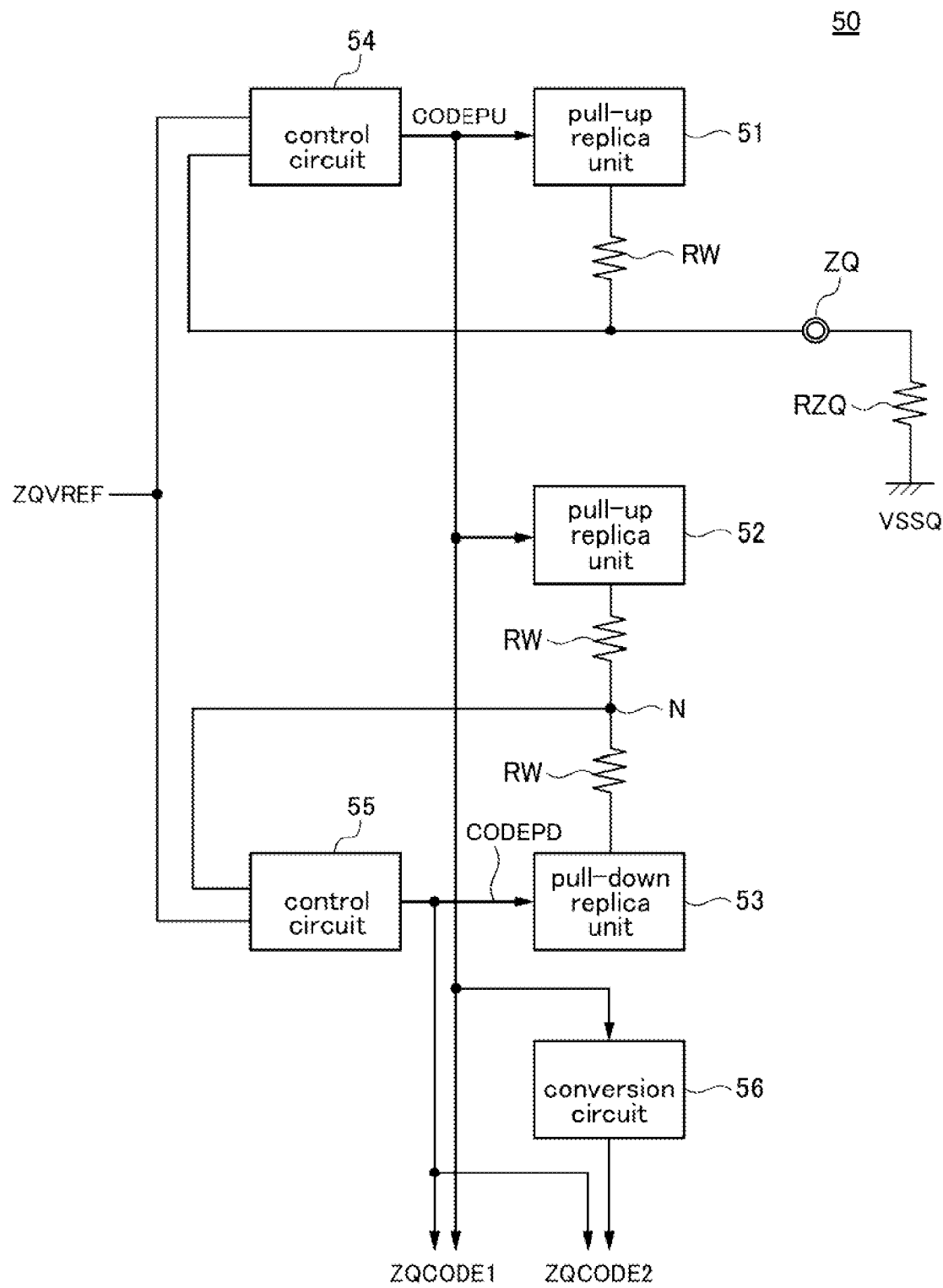
FIG. 6 is a block diagram of a calibration circuit.

FIG. 6 is a block diagram of the calibration circuit 50.

As shown in FIG. 6, the calibration circuit 50 has a pull-up replica unit 51 connected to the calibration terminal ZQ, and a pull-up replica unit 52 and a pull-down replica unit 53 that are connected to a node N. The pull-up replica units 51 and 52 are replicas of the pull-up unit PU of FIG. 4 and therefore have their impedances adjusted by the impedance code CODEPU. The pull-down replica unit 53 is a replica of the pull-down unit PD of FIG. 5 and therefore has its impedance adjusted by the impedance code CODEPD. These replica units 51 to 53 and control circuits 54 and 55 (which will be described later) are properly put in activated state or deactivated state, based on the calibration signal ZQC. Resistors RW are connected in series to the replica units 51 to 53, respectively.

The calibration circuit 50 operates in the following manner.

As the pull-up replica unit 51 is put in activated state, a voltage appearing at the calibration terminal ZQ is compared with the reference voltage ZQVREF through the control circuit 54. By this comparison, the impedance of the pull-up replica unit 51 is compared with the impedance of the reference resistance RZQ. Based on the result of this impedance comparison, the impedance code CODEPU is updated. The updated impedance code CODEPU is supplied to the pull-up replica unit 51. As a result, the impedance of the pull-up replica unit 51 is adjusted to an impedance almost equal to the impedance of the reference resistance RZQ. The impedance of the pull-up replica unit 51 is also reflected on the pull-up replica unit 52.

Subsequently, as the pull-up replica unit 52 and the pull-down replica unit 53 are put in activated state, a voltage appearing at the node N is compared with the reference voltage ZQVREF through the control circuit 55. By this comparison, the impedance of the pull-up replica unit 52 is compared with the impedance of the pull-down replica unit 53. Based on the result of this impedance comparison, the impedance code CODEPD is updated. The updated impedance code CODEPD is supplied to the pull-down replica unit 53. As a result, the impedance of the pull-down replica unit 53 is adjusted to an impedance almost equal to the impedance of the reference resistance RZQ.

By such a calibration operation, the impedance code ZQCODE1 composed of the impedance codes CODEPU and CODEPD is generated. The impedance code CODEPU is input to a conversion circuit 56 that changes a value for the impedance code CODEPU. Thus, the impedance code CODEPU having a changed value and the impedance code CODEPD makes up the impedance code ZQCODE2.

The conversion circuit 56 changes a value for the impedance code CODEPU by subtracting a given value from the value for the impedance code CODEPU so that the impedance of the pull-up unit PU becomes higher. A subtraction value is not particularly specified. It is nevertheless preferable that the subtraction value be determined to be a value by which the value for the impedance code CODEPU is reduced within a range of specified impedance so that signal integrity at execution of the write operation is improved. For example, when the subtraction value is "100b" and the value for the input impedance code CODEPU is "10101b", the changed value for the impedance code CODEPU given by the conversion circuit 56 is "10001b".

As described above, the Impedance codes ZQCODE1 and ZQCODE2 generated in such a manner are input to the selector 49 included in the data input/output circuit 40. The impedance code ZQCODE1 is selected when the read operation is carried out, and the impedance code ZQCODE2 is selected when the write operation including execution of the termination operation is carried out.

As a result, the impedance of the pull-up unit PU becomes higher at execution of the write operation than at execution of the read operation. For example, when a high-level signal is output at execution of the read operation, the impedance of each output buffer OB is 240Ω, which is equal to the impedance of the reference resistance RZQ. When the termination operation is executed during execution of the write operation, the impedance of each output buffer OB is, for example, 280Ω, which is higher than the impedance of the reference resistance RZQ. An impedance difference (40Ω in this case) is defined by the subtraction value for subtraction made by the conversion circuit 56. To obtain a desired impedance difference, therefore, the subtraction value for subtraction made by the conversion circuit 56 is determined to be a proper value.

Figure 7A:
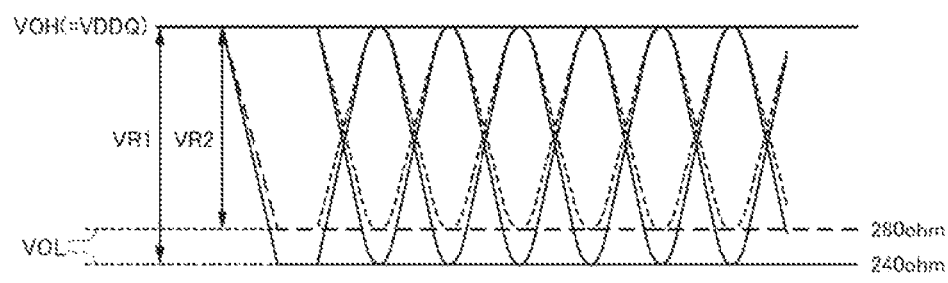
FIG. 7(A) depicts a signal waveform appearing at execution of a read operation at a data input/output terminal and FIG. 7(B) depicts a signal waveform appearing at execution of a write operation at a data input/output terminal.
Figure 7B:
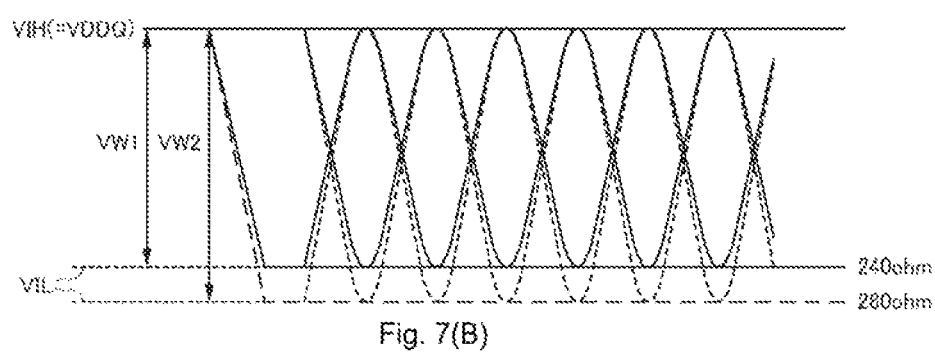

FIG. 7 depicts signal waveforms appearing at the data input/output terminal DQ, including FIG. 7(A) showing a signal waveform appearing at execution of the read operation and FIG. 7(B) showing a signal waveform appearing at execution of the write operation.

As shown in FIG. 7(A), when the impedance of the output buffer OB is adjusted to 240Ω at execution of the read operation, the amplitude VR1 of read data is obtained as a desired amplitude. Similarly, when the impedance of the output buffer OB is adjusted to 240Ω at execution of the write operation, as shown in FIG. 7(B) the amplitude VW1 of write data is obtained as a desired amplitude. According to this embodiment, however, the impedance of the output buffer OB is changed to, for example, 280Ω at execution of the write operation, as a result of which the amplitude VW1 of the write data increases to an amplitude VW2. This is because that the higher output buffer impedance suppresses termination performance to the source voltage VDDQ, which leads to a drop in the low-voltage level VIL of the write data.

If the impedance of the output buffer OB is adjusted to 280Ω also at execution of the read operation, the amplitude VR1 of the read data decreases to an amplitude VR2. This is because that the higher output buffer impedance at execution of the read operation reduces drive performance, which leads to a rise in the low-voltage level VOL of the read data.

According to this embodiment, the impedance of the output buffer OB is determined to be a default impedance (e.g., 240Ω) at execution of the read operation and to be an impedance (e.g., 280Ω) higher than the default impedance at execution of the write operation. Hence the impedances at execution of the read operation and write operation are switched dynamically. As a result, the amplitude of the write date can be increased to the amplitude VW2 at execution of the write operation without decreasing the amplitude VR1 of the read data at execution of the read operation.

Figure 8:
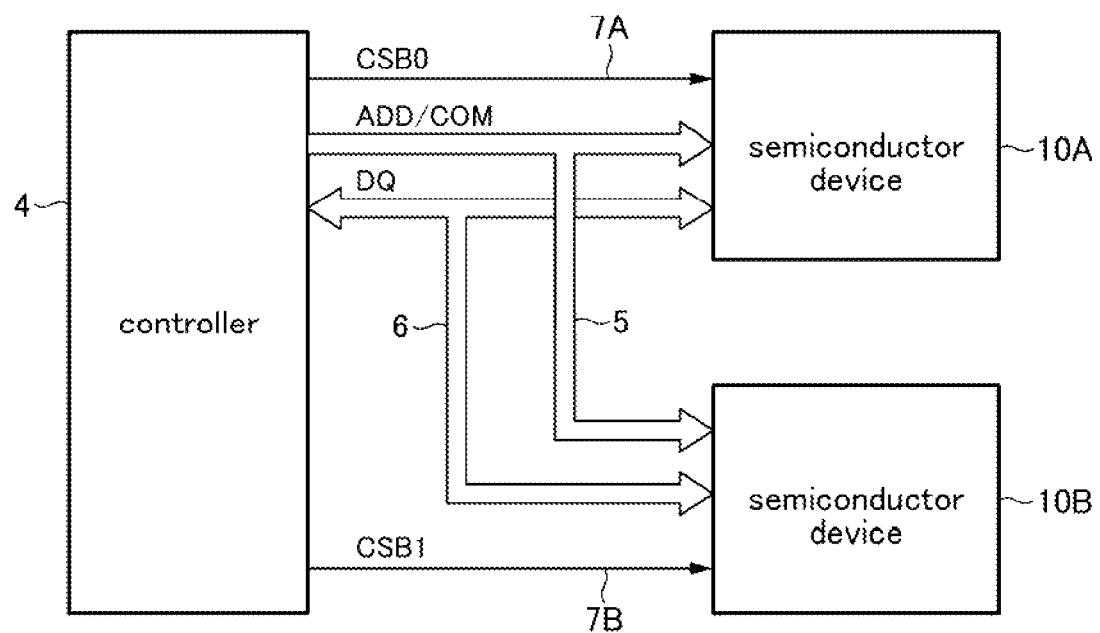
FIG. 8 is a block diagram of a configuration of an information processing system according to a second embodiment.

FIG. 8 is a block diagram of a configuration of an information processing system according to a second embodiment.

As shown in FIG. 8, the information processing system according to the second embodiment is configured such that multiple semiconductor devices 10A and 10B are connected to a controller 4. The controller 4 is connected to the semiconductor devices 10A and 10B via a common command address bus 5 and via a common data bus 6. An address signal ADD and command signal COM output from the controller 4 are, therefore, input to both semiconductor devices 10A and 10B. Write data DQ output from the controller 4 is also input to both semiconductor devices 10A and 10B.

In contrast, separate chip select signals CSB are assigned to the semiconductor devices 10A and 10B, respectively. Specifically, a chip select signal CSB0 is supplied to the semiconductor device 10A via a control bus 7A, while a chip select signal CSB1 is supplied to the semiconductor device 10B via a control bus 7B. The chip select signals CSB0 and CSB1 are signals for selecting the semiconductor devices 10A and 10B, respectively. This configuration allows the controller 4 to exclusively select one of the semiconductor devices 10A and 10B.

Figures 9A, 9B:
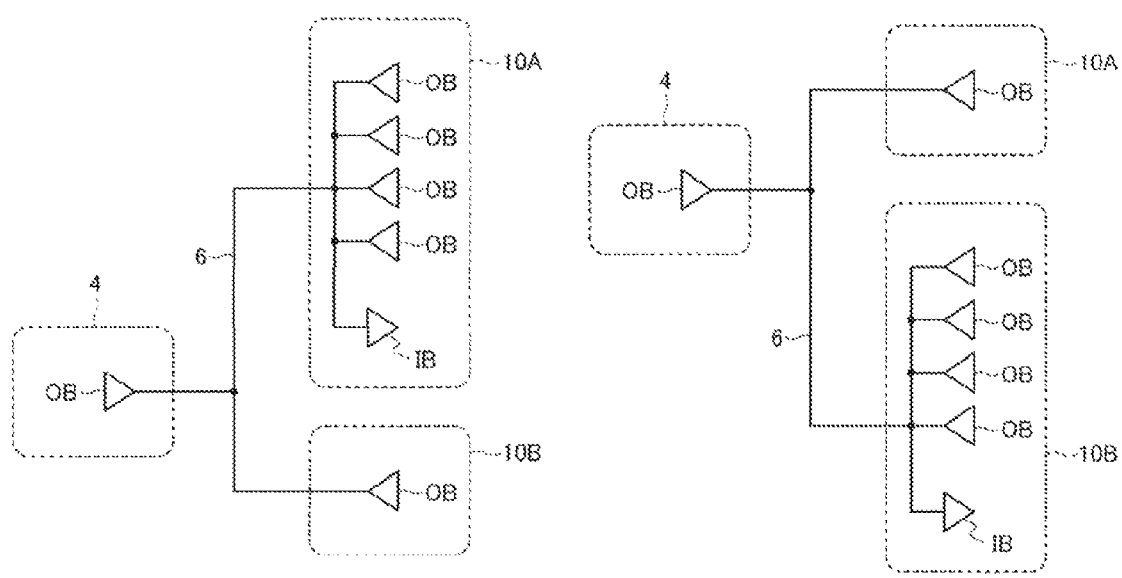
FIG. 9(A) is a diagrammatical view showing a case where the information processing system carries out a write operation on semiconductor devices.
FIG. 9(B) is a diagrammatical view showing another case where the information processing system carries out a write operation on semiconductor devices.

The information processing system having such a configuration can cause an unselected one of the semiconductor devices 10A and 10B to execute the termination operation. For example, when the write operation is executed on the semiconductor devices 10A, four output buffers OB of the selected semiconductor device 10A are activated to execute the termination operation as one output buffer OB of the unselected semiconductor device 10B is activated to execute the termination operation, as shown in FIG. 9(A). In contrast, when the write operation is executed on the semiconductor devices 10B, four output buffers OB of the selected semiconductor device 10B are activated to execute the termination operation as one output buffer OB of the unselected semiconductor device 10A is activated to execute the termination operation, as shown in FIG. 9(B).

According to this embodiment, the impedance of the output buffer OB is made higher than the default impedance not only at execution of the termination operation by the semiconductor device 10A or 10B that executes the write operation but also at execution of the termination operation by the semiconductor device 10A or 10B that is not selected for executing the write operation. As a result, the synthesized impedance of the semiconductor device 10A and 10B is enhanced. This allows the amplitude of write data to be increased at execution of the write operation.

To realize the above operation, the system should be configured such that even if the chip select signal CSB is deactivated, impedance code switching by the selector 49 can be executed through recognition of a write command. For example, when a write command is issued as the chip select signal CSB0 is activated and the chip select signal CSB1 is deactivated, the semiconductor device 10A executes the write operation while the semiconductor device 10B executes the termination operation and the impedance of the output buffer OB at that point is adjusted based on the impedance code ZQCODE2.

In addition to impedance control according to the above embodiment, the number of output buffers OB to be activated may be changed dynamically for execution of the read operation or write operation. For example, four output buffers OB may be activated at execution of the read operation and two output buffers OB may be activated at execution of the write operation. In such a case, the overall impedance of the data input/output circuit 42 relative to the data input/output terminal DQ is 60Ω (=240Ω/4) at execution of the read operation and is 140Ω (=280Ω/2) at execution of the write operation.

As described above, an apparatus comprises a data terminal DQ, a data output circuit 42 including a plurality of output buffers OB1~OB7 coupled in common to the data terminal DQ, and an impedance control circuit (a calibration circuit) 50 coupled to the data output circuit 42. The impedance control circuit 50 is configured to generate a first impedance code ZQCODE1 and a second impedance code ZQCODE2 different from the first impedance code ZQCODE1, and to apply a selected one of the first impedance code ZQCODE1 and the second impedance code ZQCODE2 to at least one of the output buffers OB1~OB7.

The impedance control circuit 50 is configured to apply the selected one of the first impedance code ZQCODE1 and the second impedance code ZQCODE2 through a selector 49. The selector 49 is configured to receive the first impedance code ZQCODE1 and the second impedance code ZQCODE2 and output the selected one of the first impedance code ZQCODE1 and the second impedance code ZQCODE2. The selector 49 is configured to select the first impedance code ZQCODE1 during a read mode and select the second impedance code ZQCODE2 during a write mode.

The apparatus further comprises a plurality of bit lines, a plurality of word lines, and a plurality of memory cells arranged at intersections of the bit lines and the word lines, respectively. Data is read from at least one of the plurality of memory cells during the read mode, data is written into at least one of the plurality of memory cells during the write mode.

The impedance control circuit 50 is configured to generate the first impedance code ZQCODE1 and the second impedance code ZQCODE2 responsive to a calibration command. The impedance control circuit 50 is configured to apply the first impedance code ZQCODE1 to at least one of the output buffers OB1~OB7 responsive to a read command, and to apply the second impedance code ZQCODE2 to at least one of the output buffers OB1~OB7 responsive to a write command different from the read command.

The apparatus further comprises a conversion circuit 56 configured to convert the first impedance code ZQCODE1 into the second impedance code ZQCODE2. The second impedance code ZQCODE2 comprises a plurality of bits of which one or more bits are converted from corresponding one or more bits of a plurality of bits of the first impedance code ZQCODE1.

A method comprises generating a first impedance code ZQCODE1 and a second impedance code ZQCODE2 different from the first impedance code ZQCODE1, selecting the first impedance code ZQCODE1 during a read mode, applying the first impedance code ZQCODE1 which is selected to a data output circuit 42 during the read mode, selecting the second impedance code ZQCODE2 during a write mode, applying the second impedance code ZQCODE2 which is selected to the data output circuit 42 during the write mode, reading data from at least one of a plurality of memory cells during the read mode, and writing data into at least one of the plurality of memory cells during the write mode.

The applying the first impedance code ZQCODE1 includes set the data output circuit 42 to have a first impedance and the applying the second impedance code ZQCODE2 includes setting the data output circuit 42 to have a second impedance. The second impedance is larger than the first impedance.

An apparatus comprises a data terminal DQ, a data input buffer IB coupled to the data terminal DQ to receive write data in a write mode, and a data output circuit 42 coupled to the data terminal DQ. The data output circuit 42 includes a plurality of output buffers OB1~OB7 of which at least one output buffer being configured to output read data to the data terminal DQ with a first impedance in a read mode and configured to be a termination resistor with a second impedance in the write mode. Another of the plurality of output buffers OB1~OB7 is configured to output the read data to the data terminal DQ with the first impedance in the read mode.

Each of the plurality of output buffers OB1~OB7 includes a pull-up unit and a pull-down unit. At least one of the pull-up unit and the pull-down unit of the at least one output buffer is configured to take different impedances in the read mode and the write mode.

The apparatus further comprises an impedance control circuit (a calibration circuit) 50 coupled to the data output circuit 42. The impedance control circuit 50 is configured to generate a first impedance code ZQCODE1 and a second impedance code ZQCODE2, and to provide the at least one output buffer with the first impedance code ZQCODE1 in the read mode and provide the at least one output buffer with the second impedance code ZQCODE2 in the write mode. The impedance control circuit 50 is configured to convert a part of the first impedance code ZQCODE1 to generate the second impedance code ZQCODE2.

It is apparent that the present invention is not limited to the above embodiments, but may be modified and changed without departing from the scope and spirit of the invention.

What is claimed is:

1. An apparatus comprising:
    a data terminal;
    a data output circuit including a plurality of output buffers coupled in common to the data terminal; and
    an impedance control circuit coupled to the data output circuit, the impedance control circuit configured to generate a first impedance code for read operations and to generate a second impedance code for termination operations, the second impedance code different from the first impedance code, and to apply a selected one of the first impedance code and the second impedance code to at least one of the output buffers.

2. The apparatus of claim 1, wherein the impedance control circuit is configured to apply the selected one of the first impedance code and the second impedance code through a selector.

3. The apparatus of claim 2, wherein the selector is configured to receive the first impedance code and the second impedance code and output the selected one of the first impedance code and the second impedance code.

4. The apparatus of claim 3, wherein the selector is configured to select the first impedance code during a first mode and select the second impedance code during a second mode.

5. The apparatus of claim 4, further comprising:
a plurality of bit lines;
a plurality of word lines; and
a plurality of memory cells arranged at intersections of the bit lines and the word lines, respectively;
wherein data is read from at least one of the plurality of memory cells during the first mode, data is written into at least one of the plurality of memory cells during the second mode.

6. The apparatus of claim 1, wherein the impedance control circuit is configured to generate the first impedance code and the second impedance code responsive to a calibration command.

7. The apparatus of claim 6, wherein the impedance control circuit is configured to apply the first impedance code to at least one of the output buffers responsive to a first command, and to apply the second impedance code to at least one of the output buffers responsive to a second command different from the first command.

8. The apparatus of claim 7, further comprising:
a plurality of bit lines;
a plurality of word lines; and
a plurality of memory cells arranged at intersections of the bit lines and the word lines, respectively;
wherein data is read from at least one of the plurality of memory cells responsive to the first command, and data is written into at least one of the plurality of memory cells responsive to the second command.

9. The apparatus of claim 1, further comprising a conversion circuit configured to convert the first impedance code into the second impedance code.

10. The apparatus of claim 9, wherein the second impedance code comprises a plurality of bits of which one or more bits are converted from a corresponding one or more bits of a plurality of bits of the first impedance code.

11. A method comprising:
generating a first impedance code and a second impedance code different from the first impedance code;
selecting the first impedance code during a first mode;
applying the first impedance code which is selected to a data output circuit during the first mode;
reading data from at least one of a plurality of memory cells during the first mode;
selecting the second impedance code during a second mode;
applying the second impedance code which is selected to the data output circuit during the second mode; and
writing data into at least one of the plurality of memory cells during the second mode.

12. The method of claim 11, wherein the applying the first impedance code includes setting the data output circuit to have a first impedance and the applying the second impedance code includes setting the data output circuit to have a second impedance.

13. The method of claim 12, wherein the second impedance is larger than the first impedance.

14. An apparatus comprising:
a data terminal;
a data input buffer coupled to the data terminal to receive write data in a write mode;
a data output circuit coupled to the data terminal, the data output circuit including a plurality of output buffers of which at least one output buffer configured to output read data to the data terminal with a first impedance in a read mode and configured to be a termination resistor with a second impedance in the write mode.

15. The apparatus of claim 14, wherein another of the plurality of output buffers is configured to output the read data to the data terminal with the first impedance in the read mode.

16. The apparatus of claim 14, wherein each of the plurality of output buffers includes a pull-up unit and a pull-down unit and at least one of the pull-up unit and the pull-down unit of the at least one output buffer is configured to take different impedances in the read mode and the write mode.

17. The apparatus of claim 14, further comprising an impedance control circuit coupled to the data output circuit, the impedance control circuit configured to generate a first impedance code and a second impedance code, and to provide the at least one output buffer with the first impedance code in the read mode and provide the at least one output buffer with the second impedance code in the write mode.

18. The apparatus of claim 17, wherein the impedance control circuit is configured to convert a part of the first impedance code to generate the second impedance code.

* * * * *